United States Patent
Saito et al.

(10) Patent No.: US 7,542,748 B2
(45) Date of Patent: Jun. 2, 2009

(54) SIGNAL PROCESSING CIRCUIT COMPRISING AN ATTENUATING UNIT, A DETECTING UNIT, AND AN ATTENUATION RATE SETTING UNIT

(75) Inventors: Yasuji Saito, Gunma (JP); Yutaka Hirakoso, Koga (JP); Masaaki Taira, Akashi (JP)

(73) Assignee: Sanyo Electric Co., Ltd., Osaka (JP)

( * ) Notice: Subject to any disclaimer, the term of this patent is extended or adjusted under 35 U.S.C. 154(b) by 278 days.

(21) Appl. No.: 10/599,240

(22) PCT Filed: Feb. 23, 2005

(86) PCT No.: PCT/JP2005/002894

§ 371 (c)(1),
(2), (4) Date: Sep. 22, 2006

(87) PCT Pub. No.: WO2005/091512

PCT Pub. Date: Sep. 29, 2005

(65) Prior Publication Data

US 2008/0233915 A1 Sep. 25, 2008

(30) Foreign Application Priority Data

Mar. 23, 2004 (JP) ............................... 2004-085123

(51) Int. Cl.
*H04B 1/10* (2006.01)
*H04B 1/16* (2006.01)
(52) U.S. Cl. ..................... 455/205; 455/249.1; 455/296

(58) Field of Classification Search ................ 455/504, 455/65, 42, 205, 226.2, 232.1, 234.1, 249.1, 455/296, 312
See application file for complete search history.

(56) References Cited

U.S. PATENT DOCUMENTS

| 4,864,637 | A | * | 9/1989 | Ishikawa et al. | ............ 455/205 |
| 5,201,062 | A | * | 4/1993 | Nakamura et al. | ........ 455/67.13 |
| 5,390,344 | A | * | 2/1995 | Nagata | ........................ 455/220 |
| 6,665,526 | B2 | * | 12/2003 | Tsuji et al. | .................. 455/296 |

FOREIGN PATENT DOCUMENTS

| JP | 06-315016 | 11/1994 |
| JP | 2003-283349 | 10/2003 |

OTHER PUBLICATIONS

Japan Patent Office, Office Action for application No. 2004-085123, mail date Oct. 14, 2008.

* cited by examiner

*Primary Examiner*—Nguyen Vo
(74) *Attorney, Agent, or Firm*—SoCal IP Law Group LLP; Steven C. Sereboff; John E. Gunther (57) ABSTRACT

A signal processing circuit is disclosed which comprises: an attenuating unit that attenuates a demodulated signal acquired by detecting a received signal; a detecting unit that detects a first signal indicating intensity of the demodulated signal; and an attenuation rate setting unit that sets an attenuation rate of the attenuating unit based on the first signal, wherein the attenuation rate setting unit sets the attenuation rate of the attenuating unit depending on: at least one signal of a second signal indicating a change in an envelope curve acquired based on an intermediate frequency signal of the received signal and a third signal indicating electric field intensity acquired based on the intermediate frequency signal; and the first signal.

6 Claims, 8 Drawing Sheets

(A) S-DC (LOW)

|  | MODULATION DEGREE (LOW) →(INTERMEDIATE)→ (HIGH) | | | | |
|---|---|---|---|---|---|
| S-AC (LOW) | 0.3 | 0.4 | 0.5 | 0.6 | 0.7 |
| S-AC (INTERMEDIATE) | 0.2 | 0.3 | 0.4 | 0.5 | 0.6 |
| S-AC (HIGH) | 0.1 | 0.2 | 0.3 | 0.4 | 0.5 |

(B) S-DC (INTERMEDIATE)

|  | MODULATION DEGREE (LOW) →(INTERMEDIATE)→ (HIGH) | | | | |
|---|---|---|---|---|---|
| S-AC (LOW) | 0.4 | 0.5 | 0.6 | 0.7 | 0.8 |
| S-AC (INTERMEDIATE) | 0.3 | 0.4 | 0.5 | 0.6 | 0.7 |
| S-AC (HIGH) | 0.2 | 0.3 | 0.4 | 0.5 | 0.6 |

(C) S-DC (HIGH)

|  | MODULATION DEGREE (LOW) →(INTERMEDIATE)→ (HIGH) | | | | |
|---|---|---|---|---|---|
| S-AC (LOW) | 0.5 | 0.6 | 0.7 | 0.8 | 0.9 |
| S-AC (INTERMEDIATE) | 0.4 | 0.5 | 0.6 | 0.7 | 0.8 |
| S-AC (HIGH) | 0.3 | 0.4 | 0.5 | 0.6 | 0.7 |

SIGNAL PROCESSING CIRCUIT COMPRISING AN ATTENUATING UNIT, A DETECTING UNIT, AND AN ATTENUATION RATE SETTING UNIT

CROSS-REFERENCE TO RELATED APPLICATION

This application claims the benefit of priority to International Patent Application PCT/JP2005/002894, filed Feb. 23, 2005, of which full contents are incorporated herein by reference.

BACKGROUND OF THE INVENTION

1. Technical Field

The present invention relates to a signal processing circuit.

2. Description of the Related Art

The FM airwaves have the same nature as light and, therefore, are reflected by buildings and mountains. Since reflected wave is temporally delayed and arrives at a reception antenna after direct wave, the reflected wave may interfere with the direct wave. If the reflected wave is strong, feeling of noise and distortion may be generated in sound output from a receiver and a degree in separation may be reduced in the case of stereo broadcast. Such a reception difficulty due to the reflected wave is referred to as multipath jamming and the generated noise is referred to as multipath noise.

An FM receiver, especially, a non-vehicle FM receiver is easily affected by the multipath noise since a relationship between the direct wave and the indirect wave changes momentarily as a vehicle moves.

Therefore, some FM receivers include a signal processing circuit that detects generation of multipath noise to attenuate a stereo composite signal demodulated by FM detection during a period when the multipath noise is detected (see, e.g., patent document 1). A conventional signal processing circuit detects a period of generation of the multipath noise based on a change in the stereo composite signal intensity and a change in an AC component of a signal meter and attenuates the stereo composite signal to reduce the feeling of noise in accordance with an attenuation rate obtained from the stereo composite signal intensity during a period when the generation of the multipath noise is detected.

Patent document 1: Japanese Patent Application Laid-Open Publication No. 2003-283349

In the conventional signal processing circuits, the attenuation rate of the stereo composite signal at the time of noise detection is set only from the stereo composite signal as described above. However, the optimum value of the attenuation rate is varied by electric field intensity and reception states such as a level of a noise component included in the received signal. Therefore, the conventional signal processing circuits cannot set the attenuation rate appropriately and the feeling of noise and distortion remains. Since the conventional signal processing circuits detects the multipath noise based on the AC component of the signal meter, if the spectrum the AC component is disturbed, the detection accuracy of the multipath noise is deteriorated. If the attenuation rate is high and the generation period of the multipath noise is long, a sound disconnection phenomenon is generated and output sound is discontinued.

The object of the present invention is to provide a signal processing circuit that can set the attenuation rate in consideration of the change in the envelope curve obtained based on the intermediate frequency and the electric field intensity in addition to intensity of a stereo composite signal to reduce the feeling of noise and distortion due to multipath noise.

SUMMARY OF THE INVENTION

In order to solve the above problems, a major aspect of the present invention provides a signal processing circuit comprising: an attenuating unit that attenuates a demodulated signal acquired by detecting a received signal; a detecting unit that detects a first signal indicating intensity of the demodulated signal; and an attenuation rate setting unit that sets an attenuation rate of the attenuating unit based on the first signal, wherein the attenuation rate setting unit sets the attenuation rate of the attenuating unit depending on: at least one signal of a second signal indicating a change in an envelope curve acquired based on an intermediate frequency signal of the received signal and a third signal indicating electric field intensity acquired based on the intermediate frequency signal; and the first signal.

Other features of the present invention will become apparent from the contents of the accompanying drawings and the description.

According to the present invention, the attenuation rate is set in consideration of information other than the intensity of the demodulated signal and, therefore, the demodulated signal is attenuated by the attenuation rate appropriate for a reception situation to reduce feeling of noise and distortion.

BRIEF DESCRIPTION OF THE DRAWINGS

For thorough understanding of the present invention and the advantages thereof, the following description should be referenced in conjunction with the accompanying drawings.

FIG. 10 is a diagram for describing a relationship between signal levels and a threshold 44a.

DETAILED DESCRIPTION OF THE INVENTION

From the contents of the description and the accompanying drawings, at least the following details will become apparent.

An embodiment of the present invention will be described with reference to the drawings.

==Configuration of FM Receiver==

The embodiment of the present invention will be described with regard to the case that a signal processing circuit of the present invention is applied to an FM stereo receiver. The present invention can be applied to both stereophonic broadcasting and monophonic broadcasting.

Figure 1:
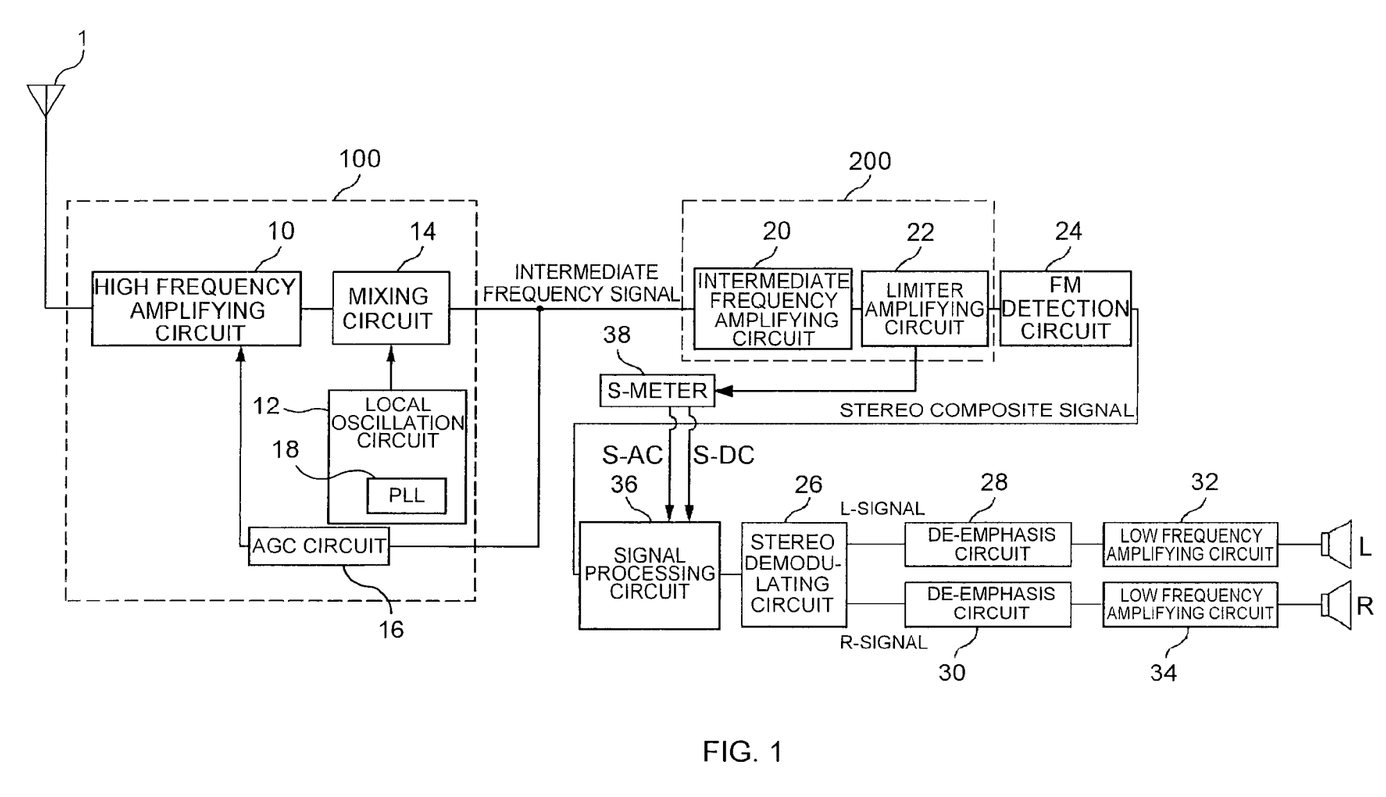
FIG. 1 is a block diagram of an FM receiver using a signal processing circuit of the present invention.

FIG. 1 is a block diagram of an example of an FM stereo receiver using a signal processing circuit 36 of the present invention. The FM stereo receiver shown in FIG. 1 includes a front end unit 100, an intermediate frequency amplifying unit 200, an FM detection circuit 24, a stereo demodulating circuit 26, de-emphasis circuits 28, 30, a low frequency amplifying circuits 32, 34, a signal processing circuit 36, and a signal meter (hereinafter, "S-meter") 38.

The front end unit 100 converts a frequency of a received signal acquired from an antenna 1 to an intermediate frequency of 10.7 MHz and outputs the signal. The front end unit 100 includes a high frequency amplifying circuit 10 that selectively amplifies only a certain frequency band of the received signal received with the antenna 1, a local oscillation circuit 12 that outputs a local oscillation signal necessary for the frequency conversion, a mixing circuit 14 that mixes the output signal of the high frequency amplifying circuit 10 and the local oscillation signal output from the local oscillation circuit 12 to output an intermediate frequency signal, and an AGC (Automatic Gain Control) circuit 16 that automatically adjusts the gain of the high frequency amplifying circuit 10 depending on the level of the intermediate frequency signal. The local oscillation circuit 12 may be a PLL frequency synthesizer including a PLL circuit 18, for example. The PLL frequency synthesizer uses a phase comparing circuit (not shown) to compare a frequency output by a voltage-controlled oscillation circuit (not shown) based on a reference frequency and generates a signal depending on the difference, if any, of the phase comparing circuit to generate a stable frequency.

The intermediate frequency amplifying unit 200 amplifies the intermediate frequency signal and removes unnecessary signals other than a predetermined frequency. The intermediate frequency amplifying unit 200 includes an intermediate frequency amplifying circuit 20 that has a filter (not shown) removing frequencies other than the predetermined frequency from the input intermediate frequency signal and an amplifying circuit (not shown) amplifying the intermediate frequency signal, and a limiter amplifying circuit 22 that removes oscillation portions other than a predetermined oscillation portion from the signal output from the intermediate frequency amplifying circuit 20 and that outputs an S-meter signal indicating an electric field intensity to the S-meter 38.

With regard to the filter in the intermediate frequency amplifying circuit 20, since phase characteristics have a significant impact on sound quality, group-delay characteristics must be flat in the pass band of the filter. However, in fact, phase retardation is generated depending on frequencies of signals passing through the filter. This filter may be a ceramic filter, for example. The limiter amplifying circuit 22 functions to remove oscillation portions other than the predetermined oscillation portion of the received signal and, if the oscillation of the reception signal is changed by the effect of noise, etc., the signal is output with the noise portion removed.

The FM detection circuit 24 demodulates the output of the limiter amplifying circuit 22 with FM detection to output a stereo composite signal ("demodulated signal"). This FM detection circuit 24 may be a PLL detection circuit that performs feedback control of the voltage-controlled oscillation circuit (not shown) so as to follow the changes in the frequency to take out an oscillation signal from the control voltage, for example. Other detection circuits include a Foster-Seely detection circuit, a ratio detection circuit, etc., and any detection mode can be applied to the signal processing circuit 36 of the present invention.

The S-meter 38 inputs the S-meter signal from the limiter amplifying circuit 22 and displays a level of reception intensity with a meter or LCD. The S-meter 38 outputs an AC component (hereinafter, "S-AC") and a DC component (hereinafter, "S-DC") to the signal processing circuit 36.

The signal processing circuit 36 inputs the stereo composite signal, the S-AC, and the S-DC, detects generation of multipath noise based on these three pieces of information, and attenuates and outputs the stereo composite signal with an attenuation rate set based on the three pieces of information when the noise is generated.

The stereo demodulating circuit 26 extracts a main-channel signal and a sub-channel signal included in the stereo composite signal and performs a matrix process of the main-channel signal and sub-channel signal to generate and output an L-signal and an R-signal.

The de-emphasis circuits 28, 30 use frequency characteristics opposite to those of the sender to attenuate the high frequency portions of the L-signal and R-signal, which are enhanced by pre-emphasis on the sender side, restore flat characteristics, and output the L-signal and R-signal to the low frequency amplifying circuits 32, 34, respectively.

The low frequency amplifying circuits 32, 34 amplify the input L-signal and R-signal and supply necessary electric power to speakers.

The above configuration demodulates the received signal into the L-signal and R-signal, and the sound based on the L-signal is output from the left speaker, and the sound based on the R-signal is output from the right speaker.

If the signal processing circuit 36 detects the generation of the multipath noise and the multipath noise is generated, since the attenuated stereo composite signal is output, the feeling of noise is auditorily reduced.

==Configuration of Signal Processing Circuit 36==

Figure 2:
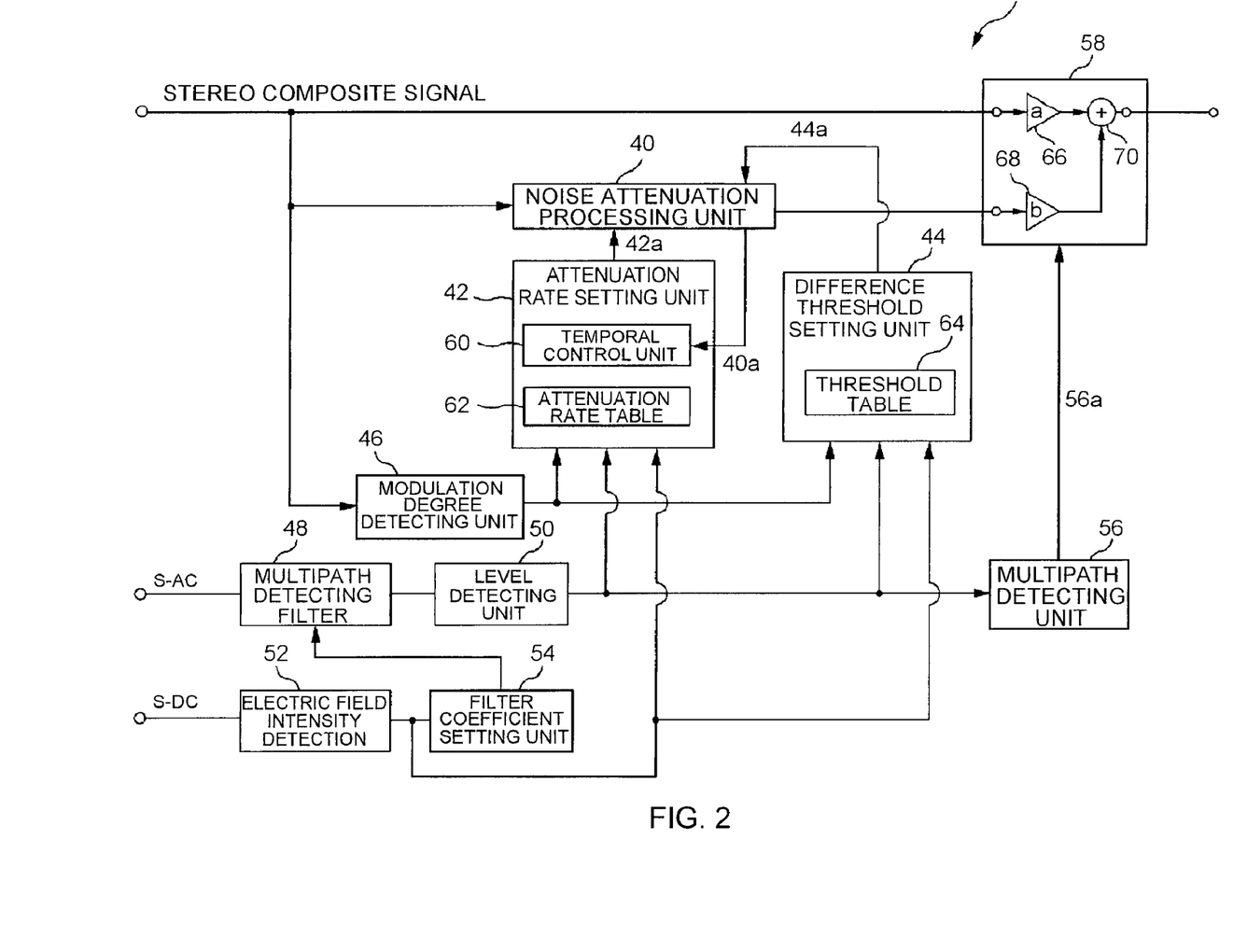
FIG. 2 is a block diagram of a configuration of the signal processing circuit of the present invention.

FIG. 2 is a block diagram of an example of a configuration of the signal processing circuit 36 of the present invention.

The signal processing circuit 36 of the present invention includes a noise attenuation processing unit 40, an attenuation rate setting unit 42, a difference threshold setting unit 44, a modulation degree detecting unit 46 ("detecting unit"), a multipath detecting filter 48, a level detecting unit 50, an electric field intensity detecting unit 52, a filter coefficient setting unit 54, a multipath detecting unit 56 ("noise detecting unit"), an output controlling unit 58.

The noise attenuation processing unit 40 detects a period when the multipath noise is generated, and attenuates and outputs the input stereo composite signal to the output controlling unit 58.

The attenuation rate setting unit 42 sets an attenuation rate 42a of the stereo composite signal depending on the outputs of the modulation degree detecting unit 46, the level detecting unit 50, and the electric field intensity detecting unit 52, and outputs the attenuation rate to an after-mentioned attenuating unit 78 in the noise attenuation processing unit 40. The attenuation rate setting unit 42 includes an attenuation rate table 62 for setting the attenuation rate 42a, and the attenuation rate 42a is set by reference to the attenuation rate table 62 depending on a level of the input signal. The attenuation rate setting unit 42 includes a temporal control unit 60 that performs temporal control of the attenuation rate 42a based on a noise detection signal 40a output from the noise attenuation processing unit 40, and counters C1, C2 (not shown) for performing the temporal control.

The difference threshold setting unit 44 sets a threshold 44a acting as a benchmark for a difference determination, depending on the outputs of the modulation degree detecting unit 46, the level detecting unit 50, and the electric field intensity detecting unit 52, to be output to an after-mentioned difference determining unit 76 in the noise attenuation processing unit 40. The difference threshold setting unit 44 includes a threshold table 64 for setting the threshold 44a and the threshold 44a is set by reference to the threshold table 64 depending on a level of the input signal.

The modulation degree detecting unit 46 detects a degree of oscillation of the stereo composite signal, i.e., intensity of the stereo composite signal and outputs a signal ("first signal") indicating the intensity to the attenuation rate setting unit 42 and the difference threshold setting unit 44.

Figure 5:
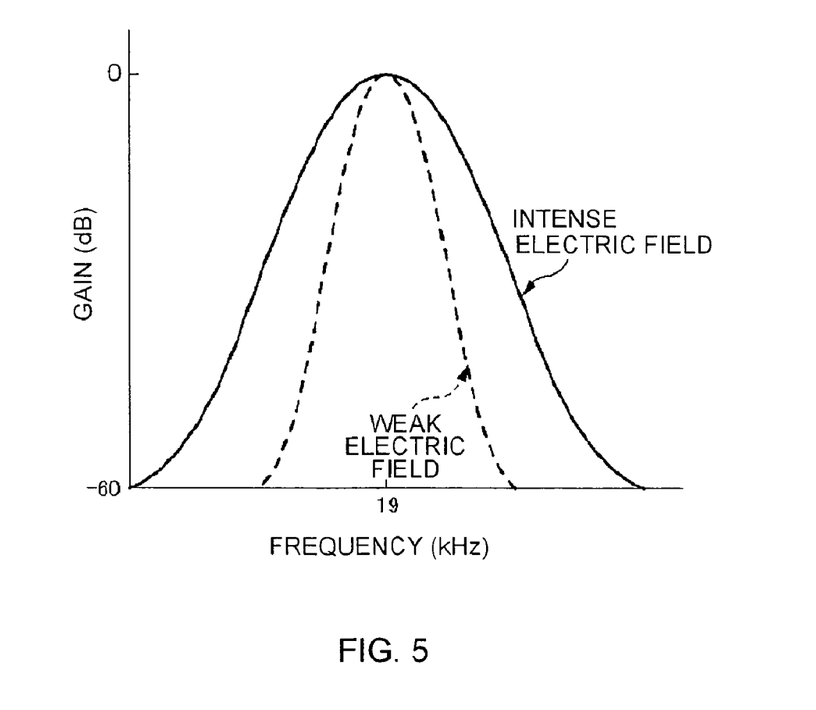
FIG. 5 shows filter characteristics of a multipath detection filter.

The multipath detecting filter 48 inputs the S-AC from the S-meter 38, and extracts and outputs alternating-current components in the vicinity of, for example, 19 kHz from the S-AC. The multipath detecting filter 48 adjusts filter characteristics depending on the output of the filter coefficient setting unit 54. FIG. 5 shows the filter characteristics of the multipath detection filter 48. As shown in FIG. 5, the multipath detecting filter 48 is a band-pass filter that extracts alternating-current components in the vicinity of 19 kHz. The multipath detecting filter 48 sets the characteristics of the band-pass filter depending on the output of the filter coefficient setting unit 54, which indicates the electric field intensity. For example, in the case of an intense electric field, the filter characteristics are set to characteristics with a wide pass-band as shown by a solid line and, in the case of a weak electric field, the filter characteristics are set to characteristics with a narrow pass-band as shown by a dotted line. By setting the filter characteristics depending on the electric field intensity, for example, if a reception state is changed to generate a weak electric field and the spectrum of the S-AC is disturbed, the detection accuracy of the multipath noise can be prevented from deteriorating.

The level detecting unit 50 outputs to the attenuation rate setting unit 42 and the difference threshold setting unit 44 a signal ("second signal") indicating a change in an envelope curve of the signal output from the multipath detecting filter 48. The electric field intensity detecting unit 52 inputs the S-DC from the S-meter 38 to detect the electric field intensity. The electric field intensity detecting unit 52 outputs to the attenuation rate setting unit 42 and the difference threshold setting unit 44 a signal ("third signal") indicating the electric field intensity.

The filter coefficient setting unit 54 sets the filter characteristics of the multipath detecting filter depending on the output of the electric field intensity detecting unit 52.

The multipath detecting unit 56 detects the generation of the multipath noise from the output of the level detecting unit 50. The multipath detecting unit 56 outputs to the output controlling unit 58 a control signal 56a ("noise detection signal") indicating the generation of the multipath noise.

The output controlling unit 58 inputs the output signal of the noise attenuation processing unit 40 and the stereo composite signal, sets amplification rates of the output signal of the noise attenuation processing unit 40 and the stereo composite signal based on the control signal 56a, and adds and outputs the output signal and the stereo composite signal. The output controlling unit 58 includes an amplifying unit 66 ("first amplifying unit") for an amplification rate a that sets the level of the stereo composite signal, an amplifying unit 68 ("second amplifying unit") for an amplification rate b that sets the level of the output signal of the noise attenuation processing unit 40, and an adding unit 70 that adds and outputs the output of the amplifying unit 66 and the output of the amplifying unit 68.

Figure 4:
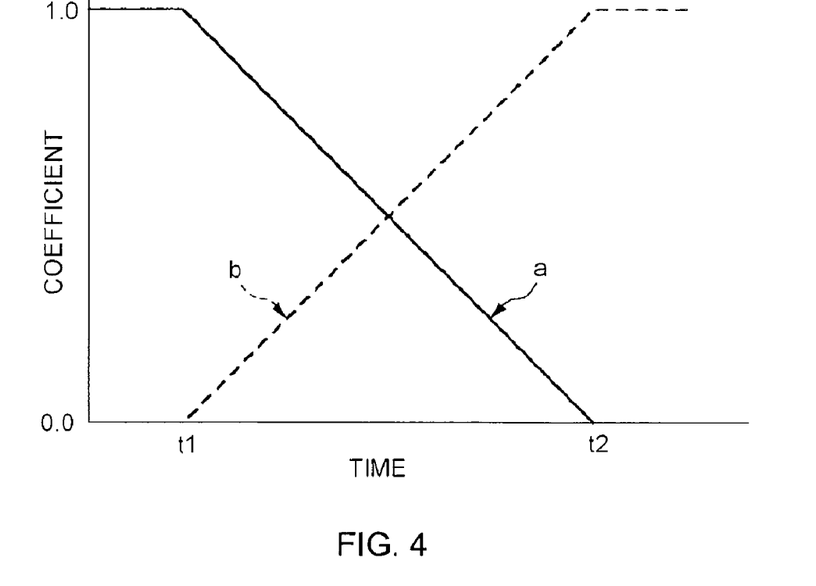
FIG. 4 shows an example of output control of an output controlling unit.

When the control signal 56a indicates the detection of the multipath noise, the output controlling unit 58 increases the amplification rate b and when the control signal 56a does not indicate the detection of the multipath noise, the output controlling unit 58 increases the amplification rate a. FIG. 4 shows an example of the output control of the output controlling unit 58. A solid line shows values of the amplification rate a of the amplifying unit 66 and a dotted line shows values of the amplification rate b of the amplifying unit 68.

When t<t1, a=1 and b=0. In this case, the multipath noise is not detected, and only the stereo composite signal is output from the output controlling unit 58.

When T1<t<t2, the multipath noise is detected at a time t1; the amplification rate a is reduced gradually; and the amplification rate b is increased accordingly. That is, the output of the stereo composite signal from the output controlling unit 58 is reduced over time and the output signal of the noise attenuation processing unit 40 is increased over time.

When t2<t, a=0 and b=1. Therefore, only the output signal of the noise attenuation processing unit 40 is output from the output controlling unit 58.

The same control is performed when the multipath noise is no longer detected after the state of detecting the multipath noise.

When the output is changed in the output controlling unit 58, discontinuation of the output from the signal processing circuit 36 can be prevented by performing fade-in/fade-out processes of the stereo composite signal and the output signal of the noise attenuation processing unit 40.

With the above configuration, the signal processing circuit 36 performs the detection of the multipath noise based on the threshold 44a acquired from the difference threshold setting unit 44. If the multipath noise is detected, the stereo composite signal input to the signal processing circuit 36 is attenuated by the noise attenuation processing unit 40 depending on the attenuation rate 42a set by the attenuation rate setting unit 42. With regard to the stereo composite signal without attenuation and the stereo composite signal attenuated by the noise attenuation processing unit 40, the amplification rates are controlled by the output controlling unit 58 in accordance with the control signals 56a acquired from the S-AC and the S-DC, respectively, and the output controlling unit 58 adds and outputs the both amplified signals.

===Configuration of Noise Attenuation Processing Unit 40===

Figure 3:
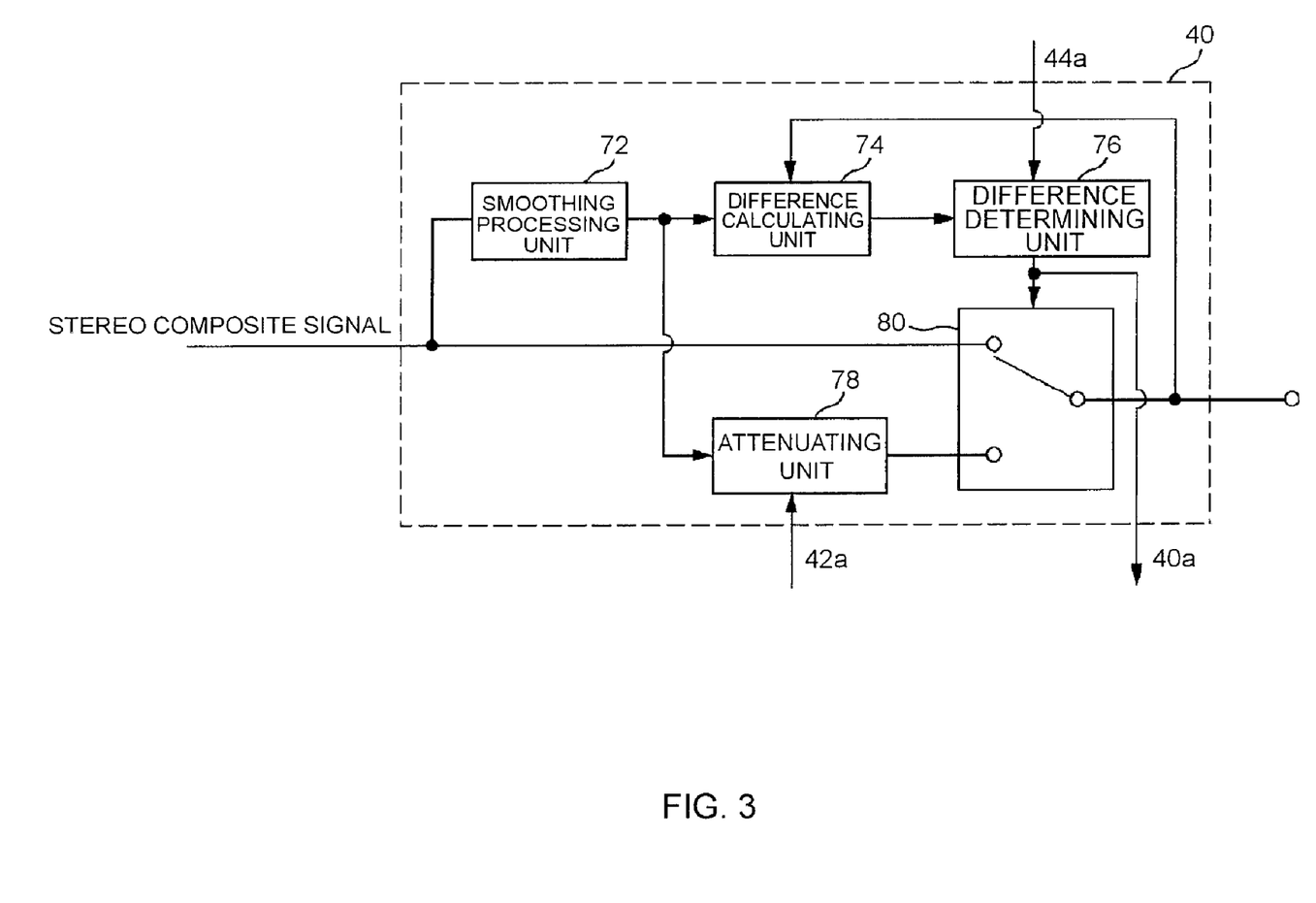
FIG. 3 is a block diagram of a configuration of a noise attenuation processing unit in the signal processing circuit of the present invention.

FIG. 3 is a block diagram of an example of a configuration of the noise attenuation processing unit 40 in the signal processing circuit 36 of the present invention.

The noise attenuation processing unit 40 includes a smoothing processing unit 72, a difference calculating unit 74, a difference determining unit 76, an attenuating unit 78, and a switching unit 80.

The smoothing processing unit 72 attenuates higher frequencies of the stereo composite signal.

Figure 11:
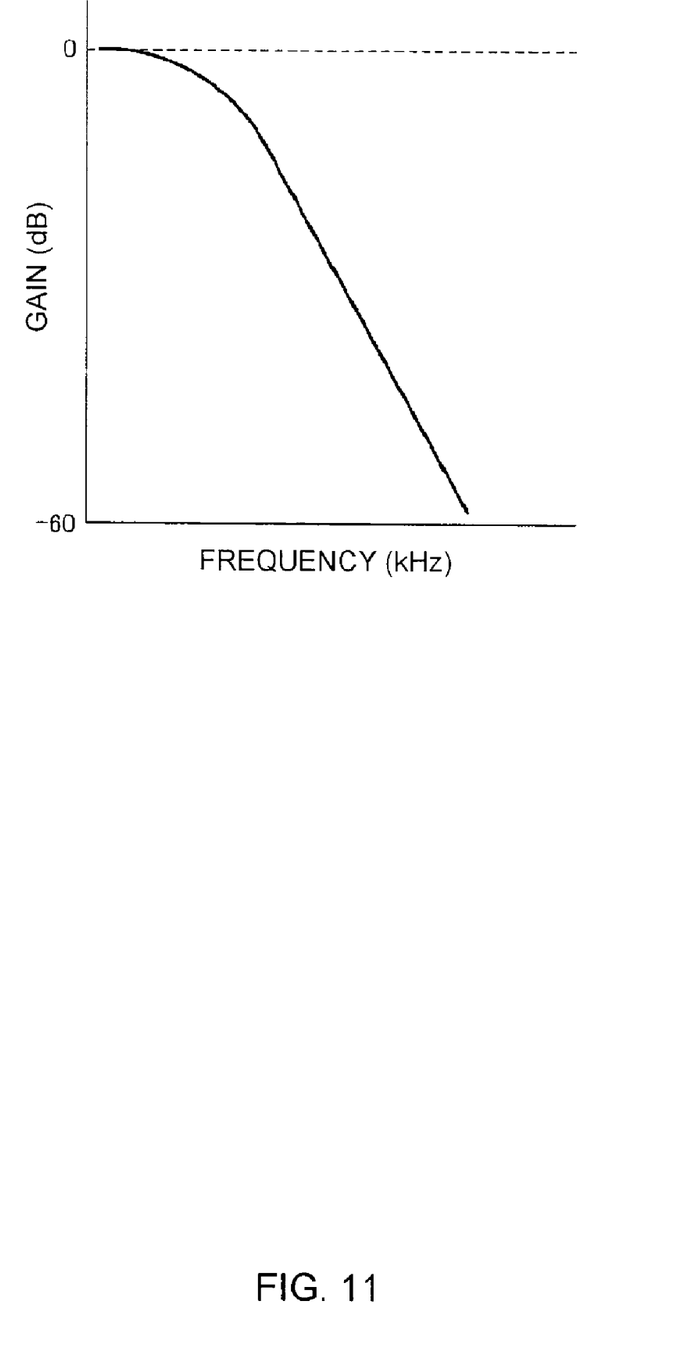
FIG. 11 shows filter characteristics of a smoothing processing unit 72.

FIG. 11 shows filter characteristics of the smoothing processing unit 72. The filter characteristics are the same as the frequency characteristics of the de-emphasis circuits 28, 30 that perform noise reduction processes. The smoothing can be effectively performed by giving the smoothing processing unit 72 the same characteristics as the de-emphasis circuits 28, 30 on the subsequent stage of the receiver.

The difference calculating unit 74 calculates an intensity difference between the stereo composite signal smoothed by the smoothing processing unit 72 and the stereo composite signal having a predetermined time difference.

The difference determining unit 76 determines whether the value calculated by the difference calculating unit 74 exceeds the threshold 44a and outputs a noise detection signal 40a indicating the result. The noise detection signal 40a is a signal indicating that noise is generated if the output value of the difference calculating unit 74 exceeds the threshold 44a, and is a signal indicating that noise is not generated if the output value does not exceed the threshold 44a.

The attenuating unit 78 attenuates the stereo composite signal smoothed by the smoothing processing unit 72 with the attenuation rate 42a.

The switching unit 80 selects the output of the attenuating unit 78 if the noise detection signal 40a indicates the detection of noise, and selects and outputs the stereo composite signal if the noise detection signal 40a does not indicate the detection of noise.

==Setting of Attenuation Rate 42a==

Description will be made of a coefficient setting operation of the attenuation rate 42a in the attenuation rate setting unit 42. As described above, the attenuation rate setting unit 42 includes an attenuation rate table 62 that sets the attenuation rate 42a depending on the intensity of the stereo composite signal output from the modulation degree detecting unit 46 (hereinafter, "modulation degree"), a degree of change in the envelope curve output from the level detecting unit 50 (hereinafter, "S-AC"), and the electric field intensity output from the electric field intensity detecting unit 52 (hereinafter, "S-DC").

Figure 6:
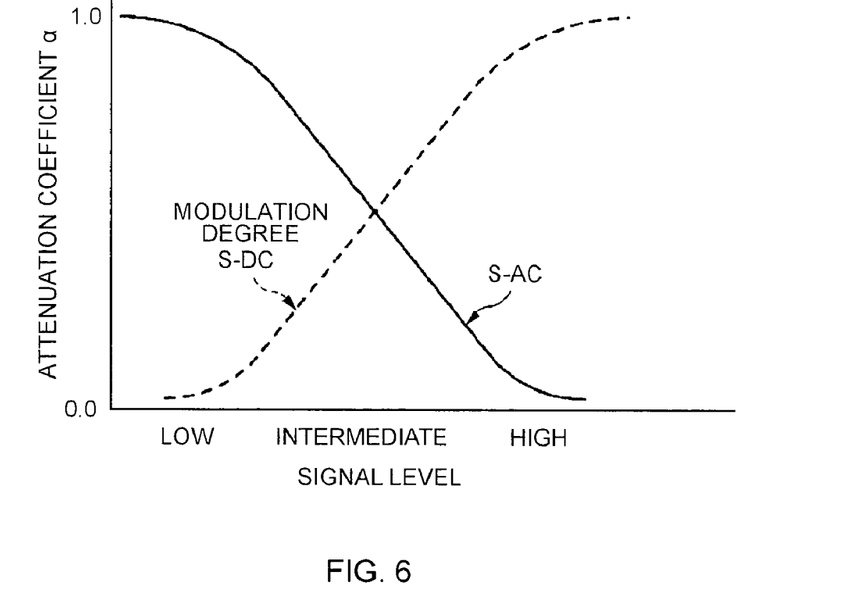
FIG. 6 is a diagram for describing a relationship between signal levels and a coefficient of an attenuation rate.

FIG. 6 is a diagram for describing a relationship among the modulation degree, signal levels of the S-AC and S-DC, and the coefficient of the attenuation rate 42a. The horizontal axis is the levels of the signals and the vertical axis is the coefficient of the attenuation rate 42a. FIG. 6 shows a relative relationship between the signal levels and the coefficient of the attenuation rate 42a. For example, if the modulation degree is high, the coefficient of the attenuation rate 42a is increased, and if the modulation degree is low, the coefficient of the attenuation rate 42a is reduced. If the S-DC is high, the coefficient of the attenuation rate 42a is increased, and if the S-DC is low, the coefficient of the attenuation rate 42a is reduced. On the other hand, if the S-AC is high, the coefficient of the attenuation rate 42a is reduced, and if the S-AC is low, the coefficient of the attenuation rate 42a is increased.

Figure 7:
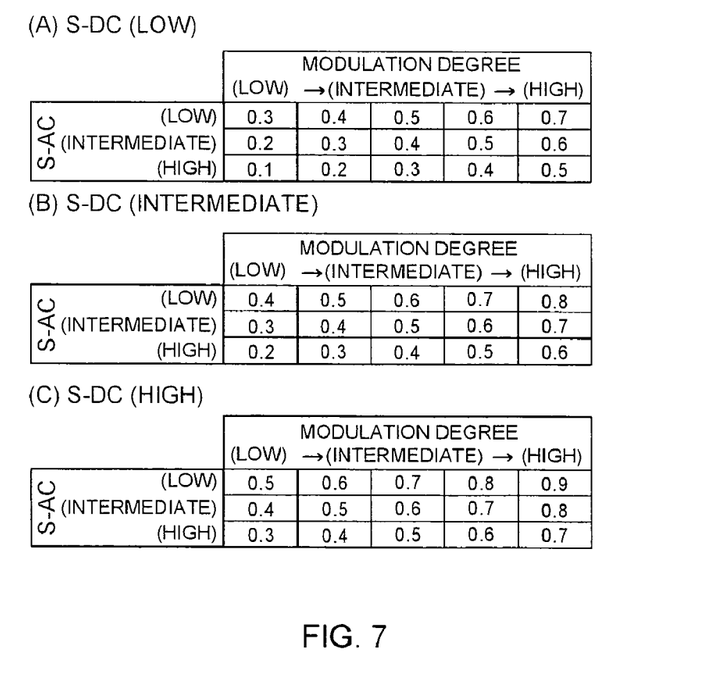
FIG. 7 is a diagram for describing setup of the attenuation rate in an attenuation rate table.

FIG. 7 is a diagram of an example of the setup of the attenuation rate 42a in the attenuation rate table 62. In this example, five stages, three stages, and three stages are preliminarily set for the levels of the modulation degree, the S-DC, and the S-AC, respectively, and the coefficient of the attenuation rate 42a is set depending on the levels of the three signals.

FIG. 7(*a*) shows the case that the S-DC is low. Five stages and three stages of the attenuation rate 42a are set for the modulation degree and the S-AC, respectively. As the modulation degree increases, the coefficient of the attenuation rate 42a increases, and as the S-AC increases, the coefficient of the attenuation rate 42a decreases.

Similarly, FIG. 7(*b*) shows the case that the S-DC is intermediate and FIG. 7(*c*) shows the case that the S-DC is high. In either case, the tendency is the same as FIG. 7(*a*). When comparing FIGS. 7(*a*), 7(*b*), and 7(*c*), as the S-DC increases, the coefficient of the attenuation rate 42a increases. The relationship between these three signals and the attenuation rate is the same as the relationship shown in FIG. 6. An appropriate coefficient can be set depending on the input signal levels by setting the attenuation rate table 62 including the coefficients of the attenuation rate 42a for the signal levels of the modulation degree, the S-AC, and the S-DC and by referring to the attenuation rate table 62 when setting the coefficient of the attenuation rate 42a.

Although the coefficient of the attenuation rate 42a is set by using three signals in this embodiment, the coefficient of the attenuation rate 42a may be set with two signals. For example, the coefficient of the attenuation rate 42a may be set with the signal levels of the modulation degree and the S-DC. Any number of stages may be set for the levels.

The attenuation rate setting unit 42 performs temporal control of the attenuation rate 42a in addition to the setting of the attenuation rate 42a.

Figure 8:
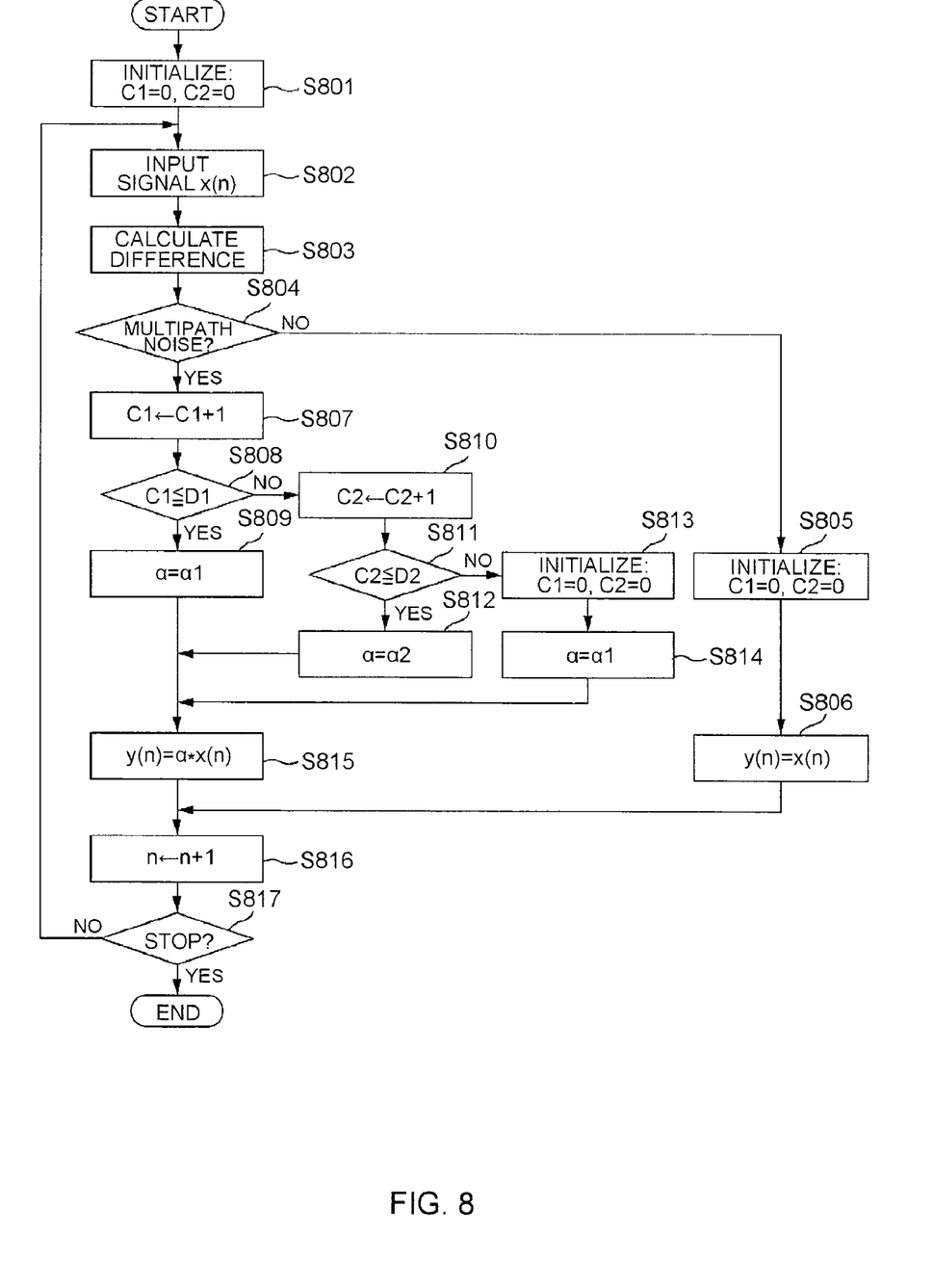
FIG. 8 is a flowchart for describing temporal control of the attenuation rate.

FIG. 8 is a flowchart for describing temporal control of the attenuation rate 42a in the signal processing circuit 36. In the following description, n is the number of samples, and X and Y indicate an input signal and an output signal, respectively. D1 and D2 are times defined in advance for the temporal control and the coefficient of the attenuation rate 42a is α.

First, the counters C1, C2 (not shown) in the attenuation rate setting unit 42 are initialized and set to zero (S801). A stereo composite signal X(n) is input to the signal processing circuit 36 (S802), and the difference calculating unit 74 calculates a difference from a stereo composite signal having a predetermined time difference (S803). If the difference determining unit 76 determines that the result of the difference calculation is smaller than a predetermined threshold, it is determined that the multipath noise is not detected (S804: NO). In this case, the counters C1, C2 (not shown) are not changed from zero (S805), and the signal processing circuit 36 outputs X(n) as an output Y(n) without modification (S806).

If the result of the difference calculation is larger than the predetermined threshold at step 804 (S804: YES), the noise detection signal 40a indicating the multipath detection is input to the temporal control unit 60, and C1+1 is input to the counter C1 (S807).

C1 and D1 are compared, and if C1 is equal to or less than D1 ("predetermined period") (S808: YES), α is set to α1 ("first attenuation rate") set in the attenuation rate table 62 (S809). If C1 is greater than D1 (S808: NO), C2+1 is input to the counter C2 (S810). C2 and D2 are compared, and if C2 is equal to or less than D2 (S811: YES), α is set to α2 ("second attenuation rate"), which has a coefficient larger than α1, i.e., which is for an attenuation rate smaller than α1 (S812). If C2 is larger than D2 at step 811 (S811: NO), the values of the counters C1, C2 are initialized (S813) and α is set to α1. The signal processing circuit 36 outputs Y(n)=α·X(n) acquired from the noise attenuation processing unit 40 (S815).

Subsequently, n+1 is entered for n (S816). If not terminated (S817: NO), the process goes back to step 802 to input X(n). If terminated (S817: YES), the process is terminated.

Figure 9:
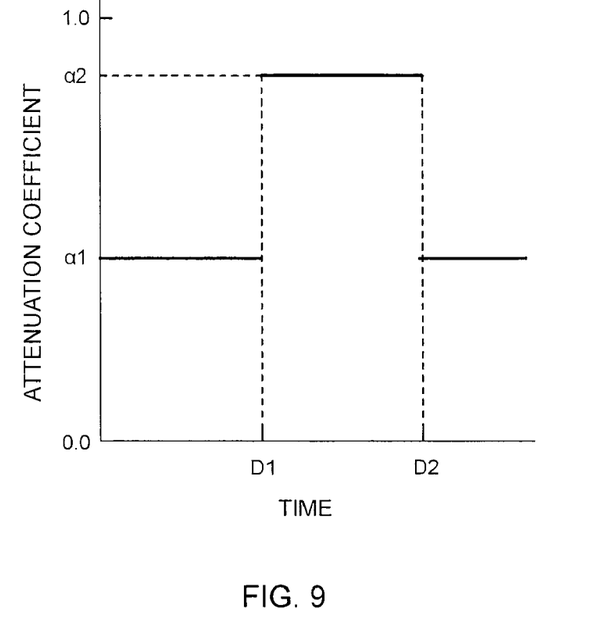
FIG. 9 shows temporal change in the attenuation rate in the temporal control.

FIG. 9 shows temporal change in the coefficient of the attenuation rate 42a controlled temporarily in the flowchart of FIG. 8. The horizontal axis is time and zero indicates the time when multipath noise is detected. D1 and D2 are predefined time widths; α1 is the coefficient of the attenuation rate 42a set by the attenuation rate table 62; and α2 is the coefficient larger than (for the attenuation rate smaller than) α1.

The attenuation rate setting unit 42 outputs the attenuation rate 42a of α1 from the multipath noise detection to D1 and outputs α2 from D1 to D2. After D2, the internal counters C1, C2 are initialized to start counting again and α1 is output.

If the multipath noise is long, discontinuation of output sound can be prevented by diminishing attenuation when the attenuation process with considerable attenuation is continued for a certain period or longer.

Although two-stage control is used in the embodiment, the control may be more segmentalized to three stages or four stages.

==Setting of Difference Threshold 44a==

The difference determining unit 76 detects the multipath noise based on whether the threshold 44a is exceeded by a difference between the intensities of the input stereo composite signal X(n) and an output Y(n-k) before k samples ("predetermined time difference"). The number k is a natural number.

As described above, the threshold 44a is set by the difference threshold setting unit 44 depending on the modulation degree, the S-AC, and the S-DC.

Figure 10:
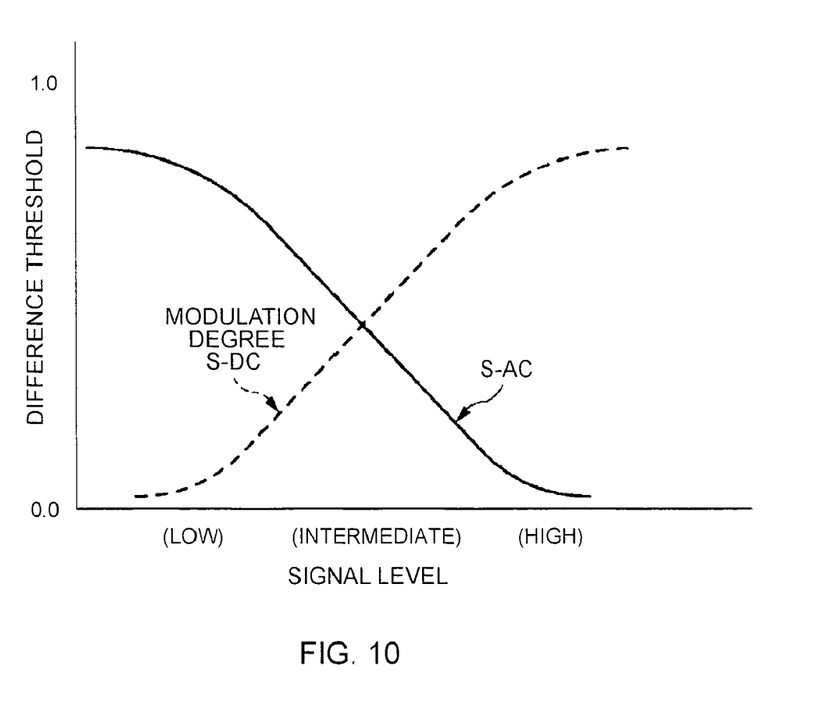

FIG. 10 is a diagram for describing a relationship between signal levels and the threshold 44a. FIG. 10 shows a relative relationship between the signal levels and the threshold 44a. For example, if the modulation degree is high, the threshold 44a is increased, and if the modulation degree is low, the threshold 44a is reduced. If the S-DC is high, the threshold 44a is increased, and if the S-DC is low, the threshold 44a is reduced. On the other hand, if the S-AC is high, the threshold 44a is reduced, and if the S-AC is low, the threshold 44a is increased. The above relationship is the same as the case of the coefficient of the attenuation rate 42a.

The difference threshold setting unit 44 includes the threshold table 64 for setting the threshold 44a. From the relationship between FIG. 6 and FIG. 10, it can be seen that the threshold table 64 can be set in the same way as the attenuation rate table 62. The threshold 44a may be temporarily controlled in the same way as the attenuation rate 42a.

By making the threshold 44a variable depending on the modulation degree, the S-AC, and the S-DC, the threshold 44a can be set adaptively to reception situations.

As described above, the signal processing circuit 36 of the present invention sets the attenuation rate 42a with the attenuation rate table 62 in consideration of the S-AC and the S-DC in addition to the modulation degree and, therefore, can constrain the feeling of noise due to the multipath noise and the feeling of distortion due to the countermeasure against noise.

The attenuation rate 42a set by the attenuation rate table 62 is controlled temporarily and changed to the attenuation rate 42a with a large coefficient when continued for a predetermined period or longer. Therefore, if the multipath noise is generated for a longer period, sound can be prevented from being discontinued due to the noise reduction process.

Since the threshold 40a used as a criterion of the noise generation detection in the difference determining unit 76 is changed in consideration of the modulation degree, the S-AC, and the S-DC, a suitable threshold can be set depending on reception situations.

Sine the attenuation process and the calculation of the difference are performed with the stereo composite signal that has passed through the smoothing processing unit 72 having the same frequency characteristics as the characteristics of the de-emphasis circuits 28, 30 on the subsequent stage, the smoothing can be performed effectively.

By changing the filter characteristics for detecting the noise generation depending on the electric field intensity, the accuracy of the noise detection is improved and the output from the output controlling unit 58 can be controlled accurately.

When the stereo composite signal and the output signal of the noise attenuation processing unit 40 are changed due to the multipath detection signal, discontinuity of the output can be prevented before and after the change.

When the signal processing circuit 36 of the present invention is applied to an FM receiver, especially, an on-vehicle FM receiver, the multipath noise can be reduced without the feeling of noise and distortion and the discontinuation of sound.

Hereinbefore, the embodiments as exemplified and as preferred at present of the signal processing circuit according to the present invention have been described specifically. The concept of the present invention, however, can be changed variously to be performed and applied, and the scope of claims hereinafter can include various modified versions aside from being limited by prior arts.

The invention claimed is:

1. A signal processing circuit, comprising
an attenuating unit that attenuates a demodulated signal acquired by detecting a received signal;
a detecting unit that detects a first signal indicating intensity of the demodulated signal;
an attenuation rate setting unit that sets an attenuation rate of the attenuating unit,
depending on the first signal and a second signal indicating a change in an envelope curve acquired based on an intermediate frequency signal of the received signal, or
depending on the first signal, the second signal, and a third signal indicating electric field intensity acquired based on the intermediate frequency signal; and
a difference determining unit that determines whether a predetermined threshold is exceeded by a difference between the demodulated signal and a signal obtained by smoothing the demodulated signal, to detect noise, wherein the attenuation rate setting unit
sets a first attenuation rate for the attenuating unit based on the detection of noise by the difference determining unit, and
after a predetermined period has elapsed from the setting, sets a second attenuation rate smaller than the first attenuation rate for the attenuating unit.

2. The signal processing circuit of claim 1 comprising:
a noise detecting unit that outputs a noise detection signal based on the second signal and the third signal; and
an output controlling unit that inputs the output of the attenuating unit and the demodulated signal, and sets amplification rates of the output of the attenuating unit and the demodulated signal based on the noise detection signal, to add and output the output of the attenuating unit and the demodulated signal amplified with the set amplification rates.

3. The signal processing circuit of claim 2, wherein the output controlling unit comprises:
a first amplifying unit that sets a level of the demodulated signal;
a second amplifying unit that sets a level of the output of the attenuating unit; and
an adding unit that adds and outputs the output of the first amplifying unit and the output of the second amplifying unit, and wherein
the output controlling unit increases the amplification rate of the second amplifying unit and performs adding and outputting, if the noise detection signal indicates that noise is detected, and wherein
the output controlling unit increases the amplification rate of the first amplifying unit and performs adding and outputting, if the noise detection signal does not indicate that noise is detected.

4. The signal processing circuit of claim 1, wherein the received signal is an FM received signal.

5. A signal processing circuit comprising:
an attenuating unit that attenuates a demodulated signal acquired by detecting a received signal;
a detecting unit that detects a first signal indicating intensity of the demodulated signal;
an attenuation rate setting unit that sets an attenuation rate of the attenuating unit,
depending on the first signal and a second signal indicating a change in an envelope curve acquired based on an intermediate frequency signal of the received signal, or
depending on the first signal, the second signal, and a third signal indicating electric field intensity acquired based on the intermediate frequency signal;
a difference determining unit that determines whether a predetermined threshold is exceeded by a difference between the demodulated signal and a signal obtained by smoothing the demodulated signal, to detect noise; and
a difference threshold setting unit that sets the threshold in the difference determining unit based on at least one signal of the first signal, the second signal, and the third signal wherein
the attenuation rate setting unit sets a first attenuation rate for the attenuating unit based on the detection of noise by the difference determining unit, and after a predetermined period has elapsed from the setting, sets a second attenuation rate smaller than the first attenuation rate for the attenuating unit.

6. A signal processing circuit comprising:
a smoothing processing unit that smoothes a demodulated signal acquired by detecting a received signal with frequency characteristics of a de-emphasis process reducing noise of the received signal;
an attenuating unit that attenuates the demodulated signal smoothed by the smoothing processing unit;
a detecting unit that detects a first signal indicating intensity of the demodulated signal;
an attenuation rate setting unit that sets an attenuation rate of the attenuating unit,
depending on the first signal and a second signal indicating a change in an envelope curve acquired based on an intermediate frequency signal of the received signal, or
depending on the first signal, the second signal, and a third signal indicating electric field intensity acquired based on the intermediate frequency signal; and
a difference determining unit that determines whether a predetermined threshold is exceeded by a difference between the demodulated signal and a signal obtained by smoothing the demodulated signal, to detect noise, wherein
the attenuation rate setting unit sets a first attenuation rate for the attenuating unit based on the detection of noise by the difference determining unit, and after a predetermined period has elapsed from the setting, set a second attenuation rate smaller than the first attenuation rate for the attenuating unit.

* * * * *